United States Patent
Watabe

(10) Patent No.: US 6,664,822 B2
(45) Date of Patent: Dec. 16, 2003

(54) DRIVING DEVICE HAVING DUMMY CIRCUIT

(75) Inventor: Kiyoto Watabe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/265,685

(22) Filed: Oct. 8, 2002

(65) Prior Publication Data

US 2003/0210081 A1 Nov. 13, 2003

(30) Foreign Application Priority Data

May 9, 2002 (JP) ........................................ 2002-133960

(51) Int. Cl.[7] .............................................. H03B 1/00
(52) U.S. Cl. ...................................... 327/108; 327/333
(58) Field of Search ................................ 327/108, 112, 327/427, 430, 431, 432, 433, 434, 435, 436, 437, 383, 389, 391, 309, 312, 333; 326/80–85

(56) References Cited

U.S. PATENT DOCUMENTS

| | | | |
|---|---|---|---|
| 5,099,138 A | * | 3/1992 | Fukunaga .................... 327/109 |
| 5,351,182 A | | 9/1994 | Miyazaki et al. ............ 363/132 |
| 5,397,878 A | * | 3/1995 | Chen ............................ 219/661 |
| 5,742,196 A | * | 4/1998 | Fronen et al. ............... 327/382 |
| 5,917,359 A | | 6/1999 | Fukunaga et al. ........... 327/381 |
| 6,326,831 B1 | | 12/2001 | Kumagai ..................... 327/333 |

FOREIGN PATENT DOCUMENTS

| | | |
|---|---|---|
| JP | 6-153533 | 5/1994 |
| JP | 9-20017 | 7/1997 |
| JP | 2000-252809 | 9/2000 |

* cited by examiner

*Primary Examiner*—My-Trang Nu Ton
(74) *Attorney, Agent, or Firm*—Oblon, Spivak, McClelland, Maier & Neustadt, P.C.

(57) ABSTRACT

A dummy circuit (303) is basically configured in the same manner as level shift circuits (203a, 203b), but an HVN-MOS (311) of the dummy circuit is always set at a non-conducting state. A mask circuit (403) removes noise in signals (S200a, S200b) outputted from the level shift circuits (203a, 203b), respectively, using a signal (S300) outputted from the dummy circuit (303). Control signals (S100a, S100b) include iterative pulses that are transmitted to S and R inputs of an RS flip-flop (502). PMOSs (215, 225) bring current paths (210, 220) into a non-conducting state in response to an output signal (S500) from the RS flip-flop (502) to thereby suspend one of the level shift circuits (203a, 203b).

9 Claims, 11 Drawing Sheets

F I G . 3
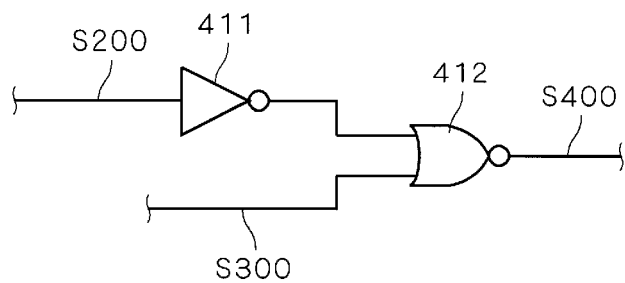
F I G . 4
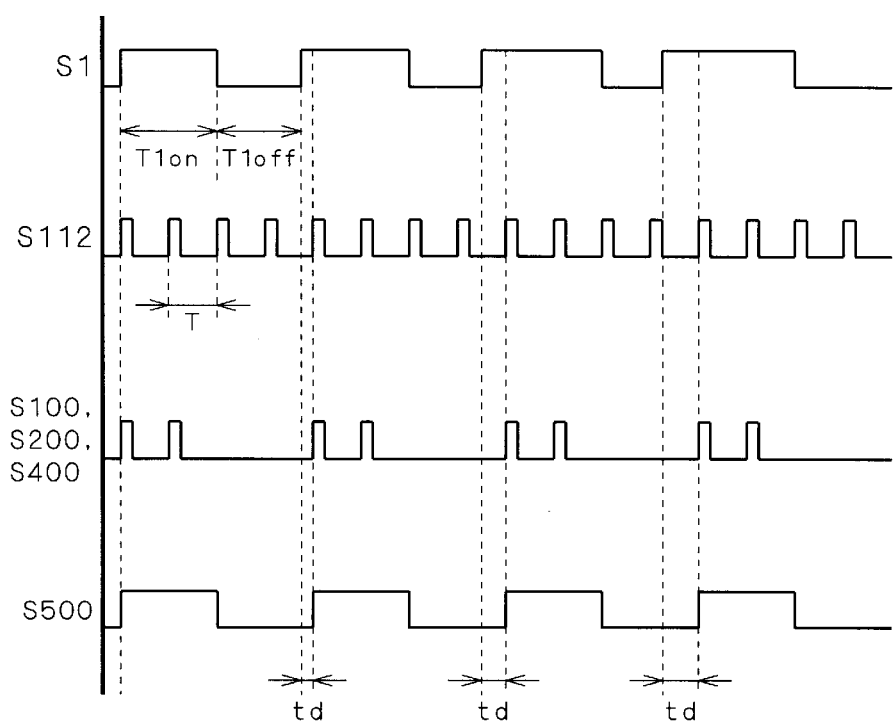

DRIVING DEVICE HAVING DUMMY CIRCUIT

BACKGROUND OF THE INVENTION

1. Field of the Invention

The present invention relates to a driving device for performing drive and control of so-called totem-pole-connected two switching devices and a technique for preventing a malfunction or incorrect action when a node or connected point between the two switching devices varies in potential.

2. Description of the Background Art

Inverters are heavily used for power devices for driving motors, for example. An inverter is powered by a power supply of a DC voltage of several hundred volts obtained by rectifying AC voltage and has a two-phase or three-phase configuration having a circuit as a unit in which two identical power switching devices are connected in series (totem-pole-connected) to the power supply. To cause the inverter to exercise a desired inverting function, the switching devices need to be switched (turned on/off) by a driving device in a correct order. ON command and OFF command for switching are low voltage signals of about several volts outputted from a drive control circuit or the like.

The low voltage signals can be supplied as they are to one of the switching devices on the low potential side, but cannot be supplied to the other switching device on the high potential side unless a reference potential is increased in level. This is because a circuit for switching the high-potential side switching device in the driving device operates at the potential of a node of the high-potential side switching device and the low-potential side switching device serving as a reference potential.

Thus, a photocoupler has conventionally been used widely to transmit low voltage signals to the high-potential side switching device, which, however, results in a considerable increase in costs. Further, research and development has recently advanced for integrating switching devices as well as their control circuits on the same semiconductor chip, in which the photocoupler has become a bottleneck in integration.

To solve such disadvantage, there is known a technique for transmitting ON and OFF commands to the high-potential side switching device through a level shift circuit.

However, such level shift circuit is provided across both circuits for switching the high-potential side and low-potential side switching devices. Thus, when the node of the both switching devices varies in potential with switching of these switching devices, noise resulting from this potential variation induces a malfunction or incorrect action of the level shift circuit (therefore, that of the driving device), resulting in a malfunction or incorrect action of the inverter.

SUMMARY OF THE INVENTION

An object of the present invention is to provide a driving device capable of preventing a malfunction or incorrect action even if a node of two switching devices varies in potential.

According to the present invention, the driving device performs drive and control of at least a high-potential side switching device of two switching devices connected in series between a first potential and a second potential higher than the first potential. The driving device includes a control signal generator, a level shifter, a dummy circuit, a mask circuit and a discriminator. The control signal generator is configured to generate a control signal for a conducting command to bring the high-potential side switching device into a conducting state and a non-conducting command to bring the high-potential side switching device into a non-conducting state, thereby outputting the control signal from an output terminal. The level shifter is connected to the output terminal of the control signal generator and configured to level-shift the control signal with at least one level shift circuit to generate a level-shifted control signal. A node between the two switching devices has a third potential. The at least one level shift circuit and the dummy circuit each include a current path provided between the first potential and a fourth potential set higher than the third potential, and a first switching device having a main path provided on the current path and a control terminal controlling conducting/non-conducting state of the main path. The control terminal of the first switching device in the at least one level shift circuit is connected to the output terminal of the control signal generator while the first switching device in the dummy circuit is always set at the non-conducting state. The at least one level shift circuit includes a first node outputting the level-shifted control signal while the dummy circuit includes a second node corresponding to the first node. The mask circuit is connected to the first node of the at least one level shift circuit and the second node of the dummy circuit and configured to mask a signal outputted from the first node using a signal outputted from the second node to generate a masked signal. The discriminator is configured to discriminate between the conducting command and the non-conducting command on the high-potential side switching device using the masked signal.

When the third potential varies with switching of the two switching devices, currents flow through the current path of the level shift circuit and that of the dummy circuit, and signals resulting from the currents are outputted from the first node of the at least one level shift circuit and the second node of the dummy circuit. Since the first switching device of the dummy circuit is always set at a non-conducting state, the signal outputted from the dummy circuit is nothing but noise resulting from the variation in the third potential. Thus, the mask circuit can remove noise from the signal outputted from the at least one level shift circuit using the signal outputted from the dummy circuit. In other words, the mask circuit can obtain, as the masked signal, the level-shifted control signal from which noise has been removed. As a result, a malfunction can be prevented.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is an explanatory circuit diagram showing a mask circuit of the driving device according to the first preferred embodiment;

FIG. 4 is a timing chart showing the operation of the driving device according to the first preferred embodiment;

DESCRIPTION OF THE PREFERRED EMBODIMENTS

<First Preferred Embodiment>

Figure 1:
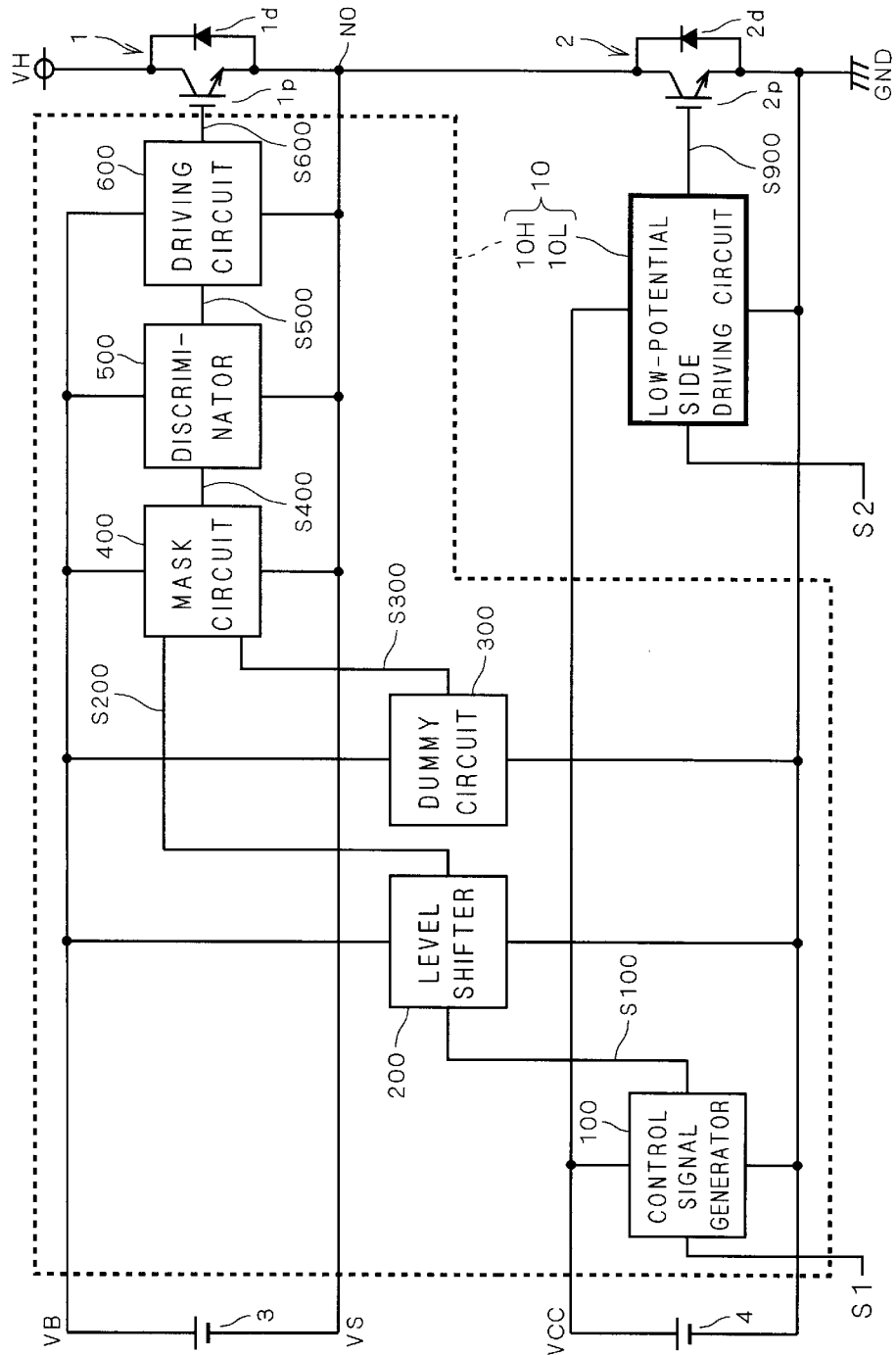
FIG. 1 is an explanatory circuit diagram showing a driving device according to the present invention.

Referring to FIG. 1, the basic structure of a driving device according to the present invention will be described.

FIG. 1 shows a driving device 10 for performing drive and control of a low-potential side switching device 2 and a high-potential side switching device 1 connected in series (so-called totem-pole-connected) in this order between a low-potential side main power supply potential (or first potential) GND and a high-potential side main power supply potential (or second potential) VH. Here, the potential GND is a ground potential, where (potential GND)<(potential VH). A load (inductive load such as a motor) not shown is connected to a connected point or node N0 between the switching devices 1 and 2.

The high-potential side switching device 1 has a power device 1p such as an IGBT (Insulated Gate Bipolar Transistor) and a freewheel diode 1d connected in antiparallel to each other. The power device 1p performs a switching operation between a potential (or third potential) VS of the node N0 serving as a reference potential and the high-potential side main power supply potential VH, and is also referred to as a high-potential side power device. Similarly, the low-potential side switching device 2 has a power device 2p and a freewheel diode 2d connected in antiparallel to each other. The power device 2p performs a switching operation between the potential (ground potential) GND serving as a reference potential and the potential VS, and is also referred to as a low-potential side power device.

The driving device 10 is broadly divided into a high-potential side driving device 10H for performing drive and control of the switching device 1 and a low-potential side driving device 10L for performing drive and control of the switching device 2.

The high-potential side driving device 10H includes a control signal generator 100, a level shifter or level shift device 200, a dummy circuit 300, a mask circuit 400, a discriminator 500 and a high-potential side driving circuit 600. The control signal generator 100 is connected between the ground potential GND and a potential VCC set higher than the potential GND to be supplied with power. The potential VCC is determined based on the ground potential GND and is supplied from a power supply or power supply circuit 4. The mask circuit 400, discriminator 500 and driving circuit 600 are connected between the potential VS of the node N0 and a potential (or fourth potential) VB set higher than the potential VS to be supplied with power. The potential VB is determined based on the potential VS, and the potential difference between the potentials VS and VB is given by a power supply or power supply circuit 3. The level shifter 200 and dummy circuit 300 are respectively connected between the potentials GND and VB to be supplied with power.

The control signal generator 100 is configured to obtain a conducting/non-conducting command signal (hereinafter also referred to as "ON/OFF command signal") S1 for a conducting command (hereinafter also referred to as "ON command") to bring the high-potential side switching device 1 into a conducting state and a non-conducting command (hereinafter also referred to as "OFF command") to bring the device 1 into a non-conducting state, thereby generating a control signal S100 in response to the ON/OFF command signal S1 to be outputted from its output terminal or output node. Here, a single ON/OFF command signal S1 contains information on both the ON command and OFF command, and a control signal S100 similarly contains information on both the commands.

The level shifter 200 is connected to the output terminal of the control signal generator 100 and includes at least one level shift circuit. The level shifter 200 is configured to level-shift (here, for step-up (or level-up)) the control signal S100 outputted from the control signal generator 100 by the at least one level shift circuit to generate and output a level-shifted control signal S200. The at least one level shift circuit has a node (or first node) for outputting the level-shifted control signal S200, which will be described in detail.

The dummy circuit 300 is connected between the potentials GND and VB in parallel to the level shifter 200. As will be described in detail, the dummy circuit 300 is of configuration substantially identical to that of the at least one level shift circuit and has a node (or second node) that corresponds to the node of the level shift circuit, for example, from which a signal S300 is outputted.

The nodes of the level shifter 200 and dummy circuit 300 are both connected to the mask circuit 400. The mask circuit 400 is configured to mask a signal (i.e., the level-shifted control signal S200 on which noise may be superimposed as will be described later) outputted from the node of the level shifter 200 by using the signal S300 outputted from the node of the dummy circuit 300 to generate and output a masked signal S400.

The discriminator 500 is configured to obtain and, by using the masked signal S400, to discriminate the conducting command and non-conducting command on the high-potential side switching device 1, thereby generating and outputting a discrimination result signal S500.

The high-potential side driving circuit 600 controls conduction/non-conduction of the switching device 1 with a control signal S600 in response to the discrimination result signal S500. The driving circuit 600 includes, for example, two N-channel MOSFETs connected in series between the potentials VS and VB for complementarily turning on/off the two MOSFETs, thereby switching the switching device 1.

Referring now to the low-potential side driving device 10L, it obtains a conducting/non-conducting command signal (ON/OFF command signal) S2 for a conducting command (ON command) to bring the low-potential side switching device 2 into a conducting state and a non-conducting command (OFF command) to bring the switching device 2 into a non-conducting state, thereby controlling conduction/ non-conduction of the switching device 2 with a control signal S900 in response to the ON/OFF command signal S2. Here, a single ON/OFF command signal S2 includes information on both the ON command and OFF command.

Next, a specific structural example of the driving device 10 will be described using a driving device 11 according to the present embodiment shown in FIG. 2. FIG. 3 shows a mask circuit 401 of the driving device 11, and FIG. 4 is a timing chart for explaining the operation of the driving device 11.

Figure 2:
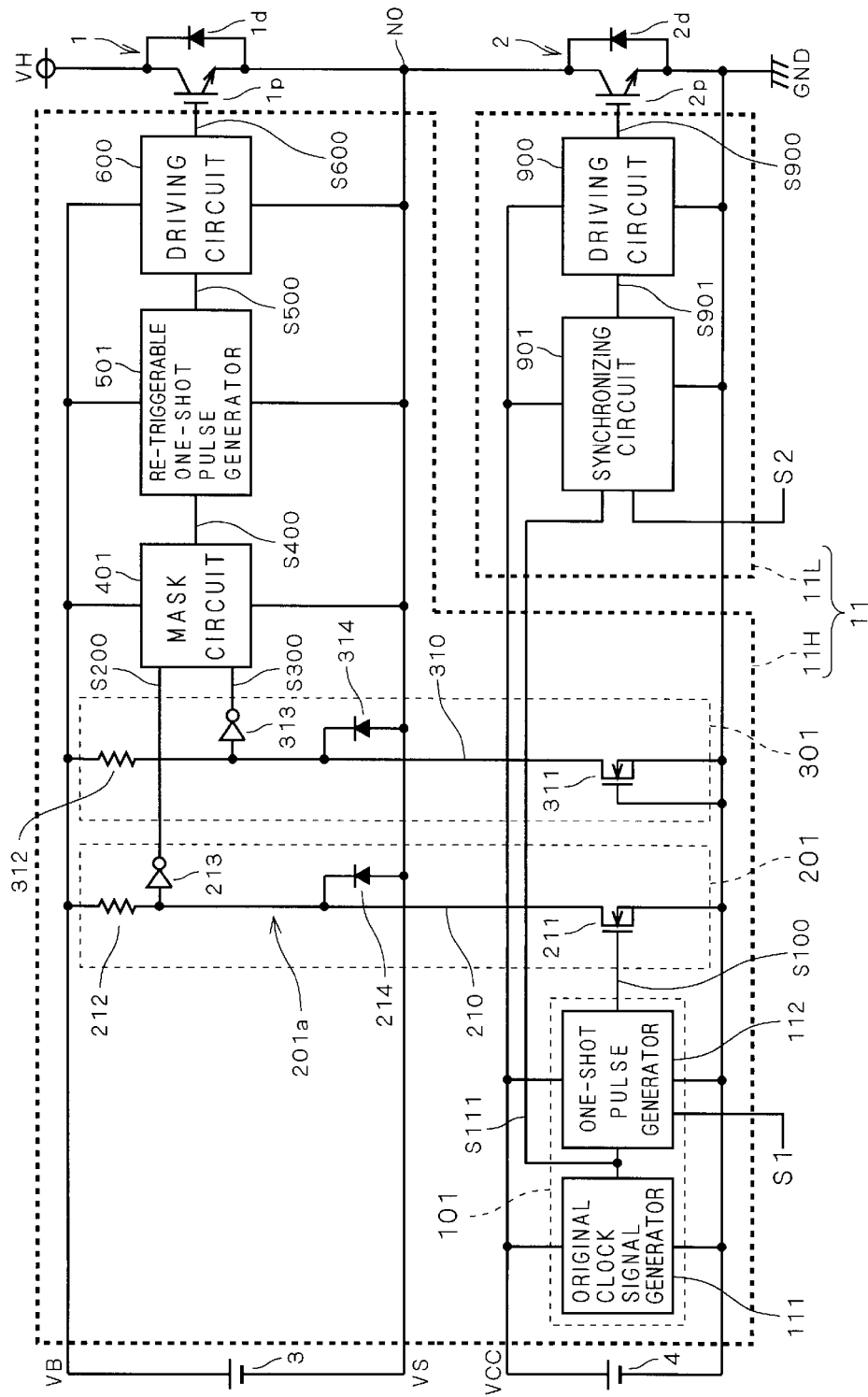
FIG. 2 is an explanatory circuit diagram showing a driving device according to a first preferred embodiment of the present invention.

As is apparent from comparison between FIGS. 1 and 2, the driving device 11 has a high-potential side driving device 11H and a low-potential side driving device 11L corresponding to the aforementioned driving devices 10H and 10L, respectively.

The driving device 11H includes a control signal generator (or selective iterative pulse signal generator) 101, a level shifter 201 having a level shift circuit 201a, a dummy circuit 301, a mask circuit 401 and a discriminator (or first discriminator) 501 as the aforementioned components 100, 200, 300, 400 and 500, respectively, and further includes the above-described driving circuit 600.

The control signal generator 101 includes an original clock signal generator 111 and a one-shot pulse generator 112, each connected between the potentials GND and VCC to be supplied with power.

The original clock signal generator 111 generates a clock signal S111 having a period of T (FIG. 4). The one-shot pulse generator 112 is configured to generate an iterative pulse signal S112 (FIG. 4) including iterative pulses (iterative pulse waveform) having the period T in synchronization with the clock signal S111. Specifically, the one-shot pulse generator 112 is configured to obtain the ON/OFF command signal S1 on the high-potential side switching device 1 and selectively output the iterative pulse signal S112 as the control signal S100 only in an ON command period T1on in the ON/OFF command signal S1. Thus, the control signal generator 101 can be called "selective iterative pulse signal generator 101" for outputting the iterative pulse signal S112 as the control signal S100 only in the ON command period T1on.

The period T of the clock signal S111 and the corresponding iterative pulses is shorter than either the period T1on or T1off in the ON/OFF command signal S1 and is set within a range of a one tenth to one several-tenth of a period of the ON/OFF command (T1on+T1off), for example.

The driving device 11 may be configured such that the control signal generator 101 outputs the iterative pulse signal S112 as the control signal S100 only in the OFF command period T1off.

The level shifter 201 includes a level shift circuit 201a. The level shift circuit 201a includes a high voltage N-channel field-effect transistor (or first switching device) 211, a level shift resistor 212, a NOT circuit (inverter circuit) 213 and a clamping diode (or clamping device) 214. A MOSFET (or MISFET) is used for the transistor in this case, and the high voltage N-channel MOSFET is also referred to as "HVNMOS".

The HVNMOS 211 has its source and drain connected to the ground potential GND and one terminal of the resistor 212, respectively, while the resistor 212 has the other terminal connected to the potential VB. Accordingly, a current path 210 is formed between the potentials GND and VB. A source-drain path (or main path) of the HVNMOS 211 is provided on the current path 210, and the conducting state/non-conducting state of the source-drain path is controlled by an input signal received at the gate (or control terminal) of the HVNMOS 211, thereby controlling the conducting state/non-conducting state of the current path 210. The HVNMOS 211 has its gate connected to an output terminal of the one-shot pulse generator 112 outputting the control signal S100 (corresponding to an output terminal of the control signal generator 101). The substrate potential of the HVNMOS 211 is set at the ground potential GND.

Further, the NOT circuit 213 has its input terminal connected between the drain of the HVNMOS 211 and the one terminal of the resistor 212. The output terminal of the NOT circuit 213 corresponds to the node (first node) outputting the level-shifted control signal S200. Although detailed illustration is omitted, the NOT circuit 213 is connected between the potentials VS and VB to be supplied with power.

Furthermore, the clamping diode 214 is connected between the current path 210 of the level shift circuit 201a and the potential VS. Specifically, the drain of the HVNMOS 211, the one terminal of the resistor 212 and the input terminal of the NOT circuit 213 are connected to the cathode of the clamping diode 214 while the anode of the clamping diode 214 is connected to the potential VS. Accordingly, even if a voltage drop of the resistor 212 is increased when a current flows over the current path 210, the potential at the input terminal of the NOT circuit 213 (i.e., potential at the drain of the HVNMOS 211 and at the one terminal of the resistor 212) is clamped to the potential VS and is prevented from becoming lower than the potential VS.

With such level shift circuit 201a, when the control signal S100 is on a high level (high-potential level), the HVNMOS 211 is brought into a conducting state and a current flows over the current path 210. The resistor 212 causes a voltage drop with this current, which brings the input terminal of the NOT circuit 213 to a low level (low-potential level). Therefore, the output terminal of the NOT circuit 213 is brought to a high level, so that the level-shifted control signal S200 having the same waveform as the control signal S100 (FIG. 4) but increased in potential is obtained. When the control signal S100 is on a low level, the control signal S100 is also level-shifted so that the level-shifted control signal S200 is obtained. In short, the control signal S100 making transition between the potentials GND and VCC, for example, is level-shifted to the signal S200 making transition between the potentials VS and VB.

The dummy circuit 301 includes an HVNMOS (or first switching device) 311, a resistor 312, a NOT circuit (inverter circuit) 313 and a clamping diode (or clamping device) 314. Specifically, these components 311 to 314 have characteristics (values) substantially equal to those of the components 211 to 214 of the level shift circuit 201a, respectively, and are connected in the same manner as the components 211 to 214 except that the HVNMOS 311 has its gate connected to the ground potential GND.

Specifically, the HVNMOS 311 has its source and drain connected to the ground potential GND and one terminal of the resistor 312, respectively, while the resistor 312 has the other terminal connected to the potential VB. Thus, a current path 310 is formed between the potentials GND and VB. At this time, a source-drain path (or main path) of the HVNMOS 311 is provided on the current path 310.

More specifically, the HVNMOS 311 in the dummy circuit 301 has its gate (or control terminal) connected to the ground potential GND different from the level shift circuit 201a, so that the HVNMOS 311 is always set at a non-conducting state. The substrate potential of the HVNMOS 311 is set at the ground potential GND.

Further, the NOT circuit 313 has its input terminal connected between the drain of the HVNMOS 311 and the one terminal of the resistor 312. The output terminal of the NOT circuit 313 is a node (second node) that corresponds to the node from which the level shift circuit 201a outputs the level-shifted control signal S200. Although detailed illustration is omitted, the NOT circuit 313 is connected between the potentials VS and VB to be supplied with power.

Furthermore, the clamping diode 314 is connected between the current path 310 of the dummy circuit 301 and the potential VS. Specifically, the drain of the HVNMOS 311, the one terminal of the resistor 312 and the input terminal of the NOT circuit 313 are connected to the cathode of the clamping diode 314, while the anode of the clamping diode 314 is connected to the potential VS. This prevents the potential at the input terminal of the NOT circuit 313 from becoming lower than the potential VS.

The mask circuit 401 includes a NOT circuit 411 and a NOR circuit 412 as shown in FIG. 3. Specifically, the NOT circuit 411 has its input terminal connected to the node from which the level-shifted control signal S200 is outputted (i.e., the output terminal of the NOT circuit 213). The output terminal of the NOT circuit 411 and the node of the dummy circuit 301 (i.e., the output terminal of the NOT circuit 313) are connected to the input terminal of the input terminal of the NOR circuit 412. The output terminal of the NOR circuit 412 is the output terminal of the mask circuit 401 and outputs the masked signal S400. As shown in FIG. 4, the masked signal S400 has the same waveform as (but is level-shifted from) the control signal S100 outputted from the control signal generator 101, which, in other words, includes iterative pulses.

The discriminator (or first discriminator) 501 includes a re-triggerable one-shot pulse generator, and is also referred to as "re-triggerable one-shot pulse generator 501". The pulse generator 501 uses each of a plurality of pulses in the masked signal S400 (that correspond to iterative pulses in the control signal S100, on which, however, noise may be superimposed as will be described) as a trigger and generate a pulse for each trigger.

Specifically, each of pulses generated by the pulse generator 501 has a width set not smaller than the period T of the iterative pulse signal S112 (FIG. 4) generated by the one-shot pulse generator 112 of the control signal generator 101, and for example, is set at a width not smaller than the period T and substantially the same as T. More specifically, the width is set slightly greater than the period T (e.g., (the period T)+(the width of iterative pulse)). Thus, as shown in FIG. 4, a plurality of the above-described pulses are joined in series to form a pulse in the discrimination result signal S500 outputted from the re-triggerable one-shot pulse generator 501. Since a period during which the control signal S100 includes iterative pulses corresponds to the ON command period T1on as described above, a pulse on a high level in which a plurality of pulses are joined in series, in the discrimination result signal S500, corresponds to (period T1on of) the ON command, and the remaining part on a low level corresponds to (period T1off of) the OFF command.

Consequently, the pulse generator 501 discriminates between (period T1on of) the ON command and (period T1off of) the OFF command using the iterativeness of the plurality of pulses included in the masked signal S400.

As has been described, the driving circuit 600 controls conduction/non-conduction of the switching device 1 with the control signal S600 in response to the discrimination result signal S500.

Referring now to the low-potential side driving device 11L, it includes a synchronizing circuit 901 and a low-potential side driving circuit 900 each connected between the potentials VCC and GND. Specifically, the synchronizing circuit 901 obtains the clock signal S111 outputted from the original clock signal generator 111 and the ON/OFF command signal S2 on the switching device 2 to synchronize the ON/OFF command signal S2 with the clock signal S111, thereby generating a signal S901. The driving circuit 900 controls conduction/non-conduction of the switching device 2 with a control signal S900 in response to the signal S901. The driving circuit 900 is configured in the same manner as the driving circuit 600.

The driving devices 10 and 11 can prevent a malfunction or incorrect action as will be described below even if the potential VS of the node N0 between the switching devices 1 and 2 varies with switching of the switching devices 1 and 2.

First, when the potential VS of the node N0 varies, currents for charging source-drain parasitic electrostatic capacitance of the HVNMOSs 211 and 311 flow over the current path 210 of the level shift circuit 201 a and the current path 310 of the dummy circuit 301, respectively. At this time, the current in the level shift circuit 201a is superimposed on the level-shifted control signal S200 as noise to be outputted from the output terminal of the circuit 201a.

The HVNMOS 311 of the dummy circuit 301 is always set at a non-conducting state. The dummy circuit 301 does not generate a signal in a normal operation. Thus, the signal S300 outputted from the aforementioned node of the dummy circuit 301 resulting from the above-mentioned currents is nothing but noise resulting from the variation in the potential VS. That is, the dummy circuit 301 functions as a noise detector.

With the mask circuit 401 configured as described above, the level-shifted control signal S200 is outputted as it is as the masked signal S400 when the signal S300 is on a low level, i.e., when noise does not appear. On the other hand, when the signal S300 is on a high level, i.e., when noise appears, noise is removed from a signal (i.e., the level-shifted control signal S200 on which noise is superimposed) to be outputted from the level shift circuit 201a, and the signal can thereafter be outputted as the masked signal S400. As described, the level-shifted control signal S200 from which noise has been removed can be obtained as the masked signal S400 using the signal S300 outputted from the dummy circuit 301.

As a result, a malfunction can be prevented even if the potential VS of the node N0 varies.

The level shift circuit 201a and the dummy circuit 301 are configured almost in the same manner. Thus, when the potential VS varies with the HVNMOS 211 of the level shift circuit 201a being in a non-conducting state, the above-mentioned currents flowing over the current paths 210 and 310 are almost equal in magnitude and timing to each other. Therefore, the effect of removing noise is significant in this case.

Conversely, when the currents flowing over the current paths 210 and 310 are shifted in timing, it is difficult to completely remove noise even with the dummy circuit 301 and mask circuit 401, which may cause a malfunction to occur and continue due to a noise pulse included in the masked signal S400 having a pulse width corresponding to the timing difference. A reason why the currents are shifted in timing is that the components of the level shift circuit 201a and those of the dummy circuit 301 vary in characteristics or that the HVNMOS 211 is in a conducting state at the switching of the high-potential side switching device 1 (in this case, the HVNMOSs 211 and 311 differ from each other in parasitic electrostatic capacitance).

However, the driving device 10 can suppress/prevent a continuation of a malfunction even when the currents flowing over the current paths 210 and 310 are shifted in timing.

Specifically, the control signal S100 outputted from the control signal generator 101 includes iterative pulses and the masked signal S400 has the same waveform as the control signal S100 (if noise does not appear) (FIG. 4) as described above. The re-triggerable one-shot pulse generator 501 generates pulses in synchronization with respective pulses included in the masked signal S400. The pulse width is set, for example, slightly greater than the period T of the iterative pulse signal S112 (FIG. 4) in the control signal S100. Thus, if the masked signal S400 includes the pulse resulting from noise (noise pulse), a pulse included in the discrimination result signal S500 corresponding to the noise pulse is a one-shot pulse and appears only in a period corresponding to the pulse width. As a result, a malfunction due to the noise pulse occurs only in a period corresponding to the width of the pulses generated by the re-triggerable one-shot pulse generator 501, after the lapse of which a normal operation is returned.

That is, the pulse generator 501 uses the iterativeness of the plurality of pulses included in the masked signal S400 to discriminate between the conducting command and non-conducting command, so that, even if the plurality of pulses include a noise pulse, a period during which the noise pulse causes a malfunction can be limited, allowing return to a normal operation.

Further, setting a threshold value of the NOT circuit 313 of the dummy circuit 301 higher than that of the NOT circuit 213 of the level shift circuit 201*a* allows a masking process at the mask circuit 401 to be performed with more reliability even when the currents flowing over the current paths 210 and 310 are shifted in timing. This is because such setting of the threshold value allows the whole period during which the level shift circuit 201*a* is on a high level to be included in a period during which the signal S300 outputted from the dummy circuit 301 is on a high level.

As has been described, the driving devices 10 and 11 can suppress/prevent a malfunction resulting from variations in the potential VS with more reliability employing double or triple remedies.

<Second Preferred Embodiment>

Figure 5:
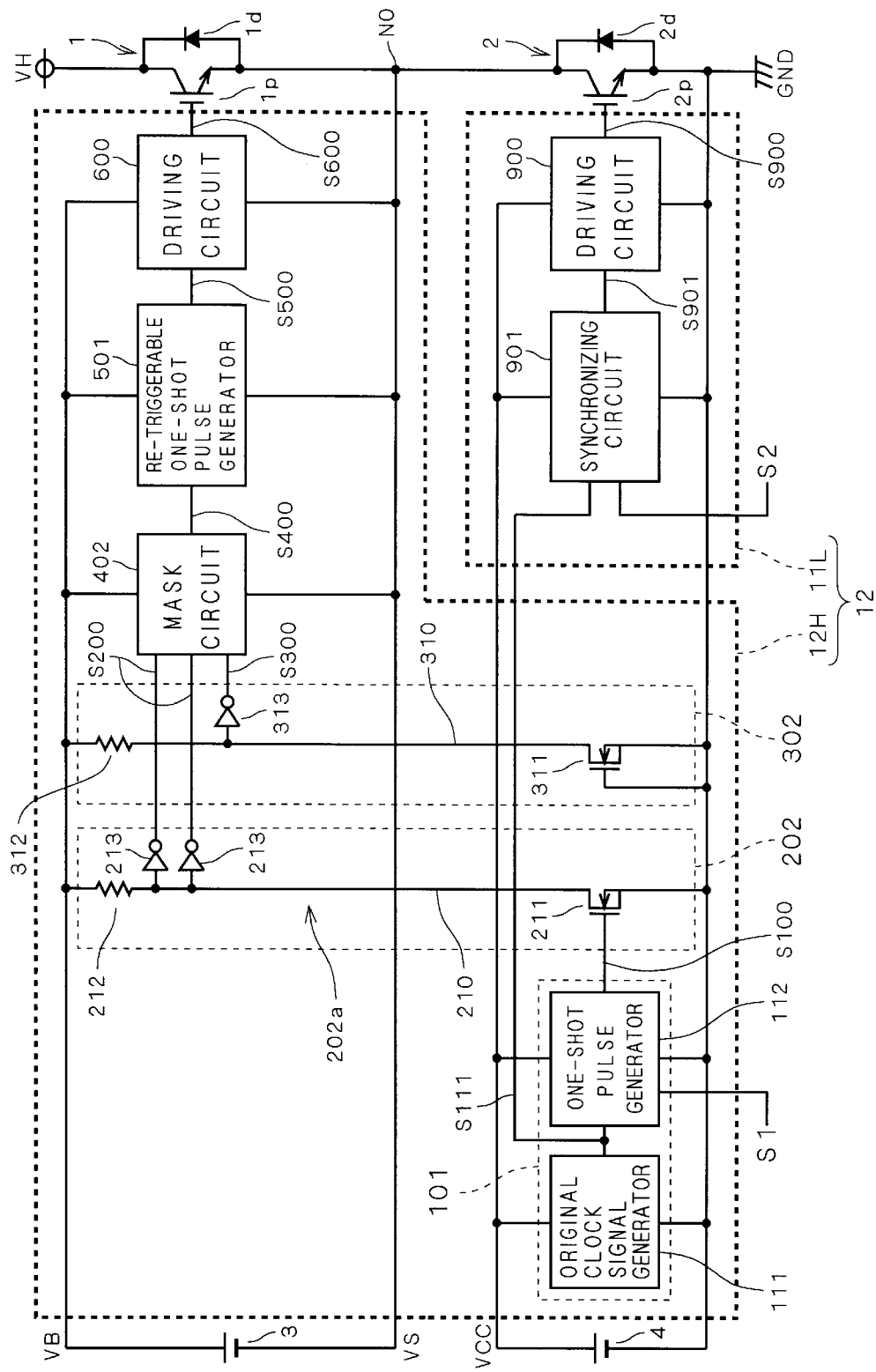
FIG. 5 is an explanatory circuit diagram showing a driving device according to a second preferred embodiment of the present invention.

Another specific structural example of the driving device 10 will be described using a driving device 12 and a mask circuit 402 according to a second preferred embodiment shown in FIGS. 5 and 6. The driving device 12 has basically the same structure as the driving device 11 except that the driving device 11H is replaced by a high-potential side driving device 12H. The driving device 12H has basically the same structure as the driving device 11H except that the level shifter 201, dummy circuit 301 and mask circuit 401 are replaced by a level shifter 202, a dummy circuit 302 and the mask circuit 402, respectively.

The level shifter 202 includes a level shift circuit 202*a* configured by removing the diode 214 from the level shift circuit 201*a* and providing with two paths leading to the mask circuit 402 from the current path 210 through two NOT circuits 213, respectively. The two NOT circuits 213 each output the level-shifted control signal S200.

The dummy circuit 302 is configured by removing the diode 314 from the dummy circuit 301.

Figure 6:
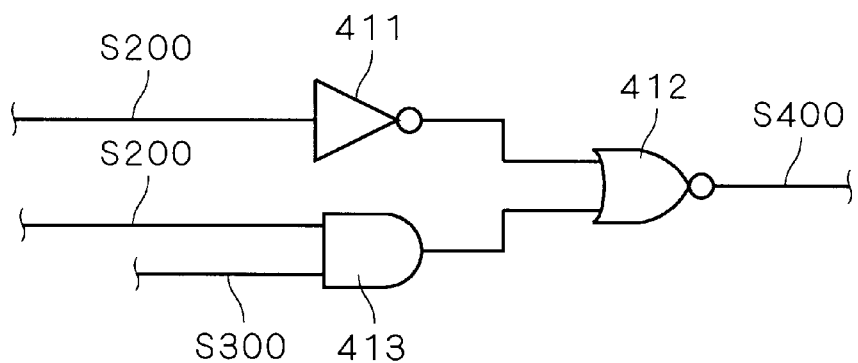
FIG. 6 is an explanatory circuit diagram showing a mask circuit of the driving device according to the second preferred embodiment.

The mask circuit 402 includes an AND circuit 413 in addition to the NOT circuit 411 and NOR circuit 412 as shown in FIG. 6. Specifically, one NOT circuit 213 of the level shift circuit 202*a* and the NOT circuit 313 of the dummy circuit 302 have their output terminals connected to the input terminal of the AND circuit 413, while the other NOT circuit 213 of the level shift circuit 202*a* has its output terminal connected to the input terminal of the NOT circuit 411. The NOT circuit 411 and NOR circuit 412 have their output terminals connected to the input terminal of the NOR circuit 412. The NOR circuit 412 outputs the masked signal S400. In the mask circuit 402 of such configuration, the AND circuit 413 detects noise, noting that noise resulting from variations in the potential VS is transmitted in the same phase.

The level shift circuit 202*a* may be provided with one NOT circuit 213 such that the level-shifted control signal S200 outputted from the NOT circuit 213 is inputted to both the NOT circuit 411 and AND circuit 413.

Further, setting threshold values of the one NOT circuit 213 and the NOT circuit 313 connected to the AND circuit 413 higher than a threshold value of the other NOT circuit 213 connected to the NOT circuit 411 allows a masking process at the mask circuit 402 to be performed with more reliability.

The driving device 12 can achieve the same effects as the above-described driving devices 10 and 11.

<Third Preferred Embodiment>

Figure 8:
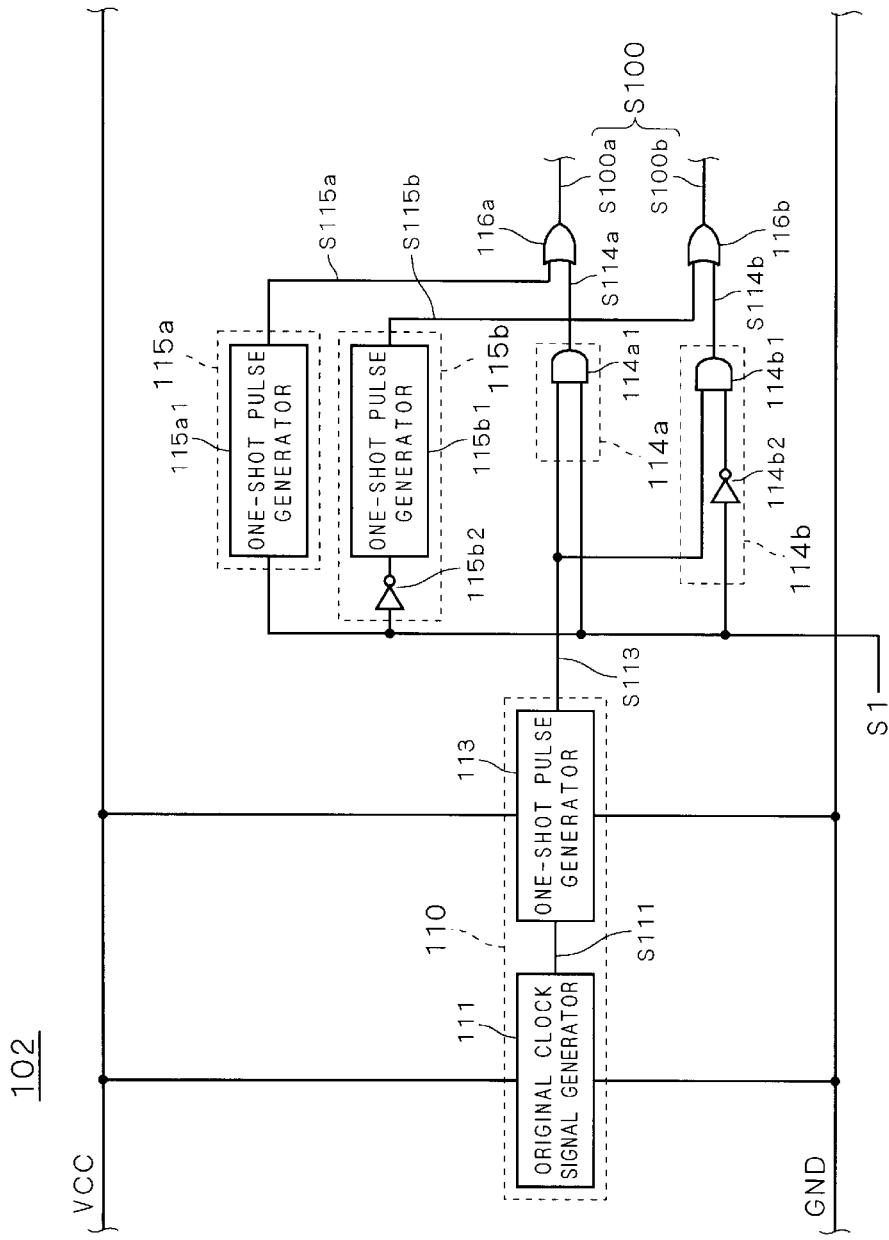
FIG. 8 is an explanatory circuit diagram showing a control signal generator of the driving device according to the third preferred embodiment.
Figure 9:
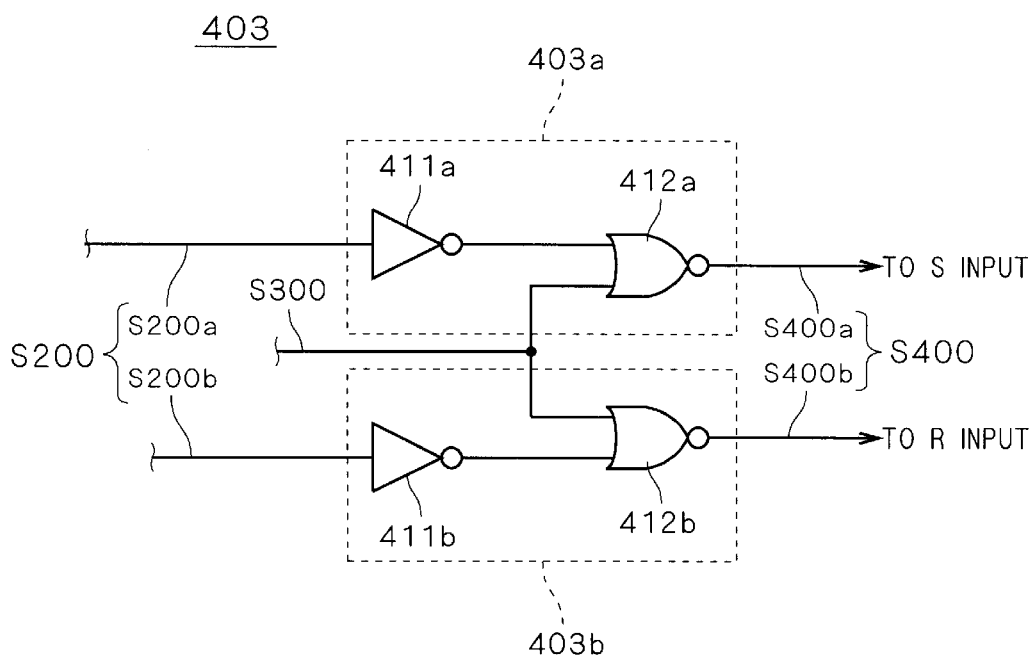
FIG. 9 is an explanatory circuit diagram showing a mask circuit of the driving device according to the third preferred embodiment.
Figure 10:
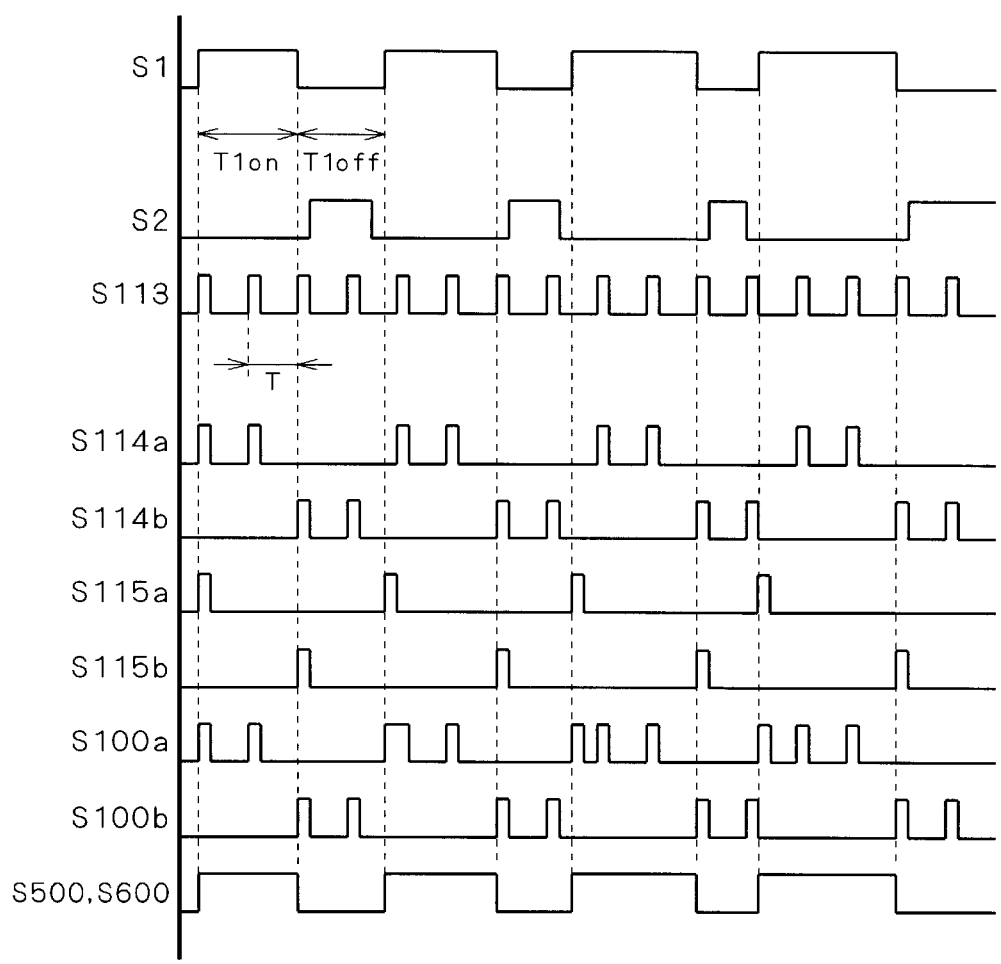
FIG. 10 is a timing chart showing the operation of the driving device according to the third preferred embodiment.

A third specific structural example of the driving device 10 will be described using a driving device 13 according to a third preferred embodiment shown in FIG. 7. FIGS. 8 and 9 show a control signal generator 102 and a mask circuit 403 of the driving device 13, and FIG. 10 is a timing chart for explaining the operation of the driving device 13. The driving device 13 has basically the same structure as the driving device 11 except that the driving devices 11H and 11L are replaced by a high-potential side driving device 13H and a low-potential side driving device 12L, respectively.

The driving device 13H includes the control signal generator 102, a level shifter 203, a dummy circuit 303, the mask circuit 403 and a discriminator (or second or third discriminator) 503 as the aforementioned components 100, 200, 300, 400 and 500, respectively, and further includes the above-described driving circuit 600.

As shown in FIG. 8, the control signal generator 102 includes an iterative pulse signal generator 110, first and second selectors 114*a*, 114*b*, an ON transition pulse (or conducting transition pulse) generator 115*a*, an OFF transition pulse (or non-conducting transition pulse) generator 115*b* and OR circuits 116*a* and 116*b*.

Specifically, the iterative pulse signal generator 110 includes the original clock signal generator 111 and a one-shot pulse generator 113. The one-shot pulse generator 113 is connected between the potentials VCC and GND to be supplied with power and is configured to obtain the clock signal S111 to generate and output an iterative pulse signal S113 (cf. FIG. 10; corresponding to the iterative pulse signal S112 shown in FIG. 4) including iterative pulses (iterative pulse waveform) having the period T in response to the clock signal S111.

The first selector 114*a* includes an AND circuit 114*a*1 connected to receive the iterative pulse signal S113 and ON/OFF command signal S1. Accordingly, the iterative pulse signal S113 is selectively outputted as an output signal S114*a* from the first selector 114*a* only in the ON command period T1on (FIG. 10).

The ON transition pulse generator 115*a* includes a one-shot pulse generator 115*a*1 connected to receive the ON/OFF command signal S1. The one-shot pulse generator 115*a*1 is configured to generate ON transition pulses in synchronization with rising of pulses in the ON/OFF command signal S1 (corresponding to transition from the OFF command to ON command) to be outputted as a signal S115*a* (FIG. 10). The ON transition pulses are set at the same width as the iterative pulses generated by the one-shot pulse generator 113.

The OR circuit 116*a* is connected to receive the output signal S114*a* of the first selector 114*a* and the output signal S115*a* of the ON transition pulse generator 115*a*. An operation result of the OR circuit 116*a* is outputted from the output terminal (or conduction control signal output terminal) of the OR circuit 116*a* as an ON control signal (or conduction control signal) S100*a*. The iterative pulses in the signal 114*a* and the ON transition pulses in the signal 115*a* are superimposed on each other in the ON control signal S100*a* (FIG. 10).

On the other hand, the second selector 114*b* includes an AND circuit 114*b*1 and a NOT circuit 114*b*2. The second selector 114*b* is configured such that the AND circuit 114*b*1 receives the iterative pulse signal S113 and the ON/OFF command signal S1 with its waveform inverted by the NOT circuit 114*b*2. Accordingly, the iterative pulse signal S113 is selectively outputted as the output signal S114*b* from the second selector 114*b* only in the OFF command period T1off (FIG. 10).

The OFF transition pulse generator 115*b* includes a one-shot pulse generator 115*b*1 and a NOT circuit 115*b*2. The pulse generator 115*b* is configured such that the one-shot pulse generator 115*b*1 receives the ON/OFF command signal S1 with its waveform inverted by the NOT circuit 115*b*2. The one-shot pulse generator 115*b*1 is configured to generate OFF transition pulses in synchronization with rising of pulses of the ON/OFF command signal S1 with inverted waveform (corresponding to transition from the ON command to OFF command) to be outputted as a signal S115*b*. The OFF transition pulses are set at the same width as the iterative pulses generated by the one-shot pulse generator 113.

The OR circuit 116*b* is connected to receive the output signal S114*b* of the second selector 114*b* and the output signal S115*b* of the OFF transition pulse generator 115*b*. An operation result of the OR circuit 116*b* is outputted from the output terminal (or non-conduction control signal output terminal) of the OR circuit 116*b* as an OFF control signal (or non-conduction control signal) S100*b*. The iterative pulses in the signal 114*b* and the OFF transition pulses in the signal 115*b* are superimposed on each other in the ON control signal S100*b* (FIG. 10).

The control signals S100*a* and S100*b* outputted from the OR circuits 116*a* and 116*b*, respectively, generically correspond to the control signal S100 outputted from the control signal generator 100, and the output terminals of the OR circuits 116*a* and 116*b* generically correspond to the output terminal of the control signal generator 100.

The level shifter 203 includes two level shift circuits (or first and second level shift circuits) 203*a* and 203*b*.

The first level shift circuit 203*a* is basically configured to have a P-channel field-effect transistor (or second switching device) 215 added to the level shift circuit 201*a* shown in FIG. 2. A MOSFET (or MISFET) is used for the transistor 215 in this case. The P-channel MOSFET is also referred to as "PMOS".

The PMOS 215 is inserted such that the source-drain path of the PMOS 215 is provided on the current path 210. Specifically, the PMOS 215 has its source connected to the node between the input terminal of the NOT circuit 213 and the one terminal of the resistor 212 and its drain connected to the node between the cathode of the diode 214 and the drain of the HVNMOS 211. In this case, the PMOS 215 is provided between the diode (or clamping device) 214 and the potential VB, i.e., between the potentials VS and VB. The PMOS 215 has its gate connected to a Q output of an RS flip-flop serving as the discriminator 502. Thus, the PMOS 215 controls the conducting/non-conducting estate of the current path 210 in response to the discrimination result signal S500 outputted from the discriminator 502. The substrate potential of the PMOS 215 is set at the potential VB.

In the first level shift circuit 203*a*, the HVNMOS 211 has its gate connected to the output terminal (or conduction control signal output terminal) of the OR circuit 116*a* of the control signal generator 102 from which the ON control signal (or conduction control signal) S100*a* is outputted, and a level-shifted ON control signal (or level-shifted conduction control signal) S200*a* is outputted from the output terminal of the NOT circuit 213.

The second level shift circuit 203*b* includes an HVNMOS 221, a level shift resistor 222, a NOT circuit 223, a clamping diode 224 and a PMOS 225 having characteristics (values) almost equal to those of the components 211 to 215 of the first level shift circuit 203*a*, respectively, and is basically configured in the same manner as the first level shift circuit 203*a*. Accordingly, the second level shift circuit 203*b* forms a current path 220 between the potentials GND and VB.

In the second level shift circuit 203*b*, the HVNMOS 221 has its gate connected to the output terminal (or non-conduction control signal output terminal) of the OR circuit 116*b* in the control signal generator 102 from which the OFF control signal (or non-conduction control signal) S100*b* is outputted, and a level-shifted OFF control signal (or level-shifted non-conduction control signal) S200*b* is outputted from the output terminal of the NOT circuit 223. The second level shift circuit 203*b* further includes a NOT circuit 251 having its input terminal connected to the Q output of the RS flip-flop serving as the discriminator 502 and its output terminal connected to the gate of the PMOS 225. Accordingly, the PMOS 225 controls the conducting/non-conducting state of the current path 220 in response to (an inverted signal of) the discrimination result signal S500 outputted from the discriminator 502.

In the level shifter 203, the level-shifted ON control signal S200*a* and the level-shifted OFF control signal S200*b* generically correspond to the level-shifted control signal S200.

The dummy circuit 303 is configured to have a PMOS 315 added to the dummy circuit 301 shown in FIG. 2. The PMOS 315 has characteristics (values) almost equal to those of the PMOSs 215 and 225 of the level shift circuits 203*a* and 203*b* and is provided on the current path 310 similarly to the PMOSs 215 and 225. However, the PMOS 315 has its gate connected to the potential VS. The components (e.g., HVNMOS 211, 221, 311) corresponding to one another between the dummy circuit 303 and the level shift circuits 203*a* and 203*b* have characteristics (values) substantially equal to one another.

The mask circuit 403 is broadly divided into first and second mask circuits 403*a* and 403*b* as shown in FIG. 9. As is apparent from comparison between FIGS. 9 and 3, the mask circuits 403*a* and 403*b* each have a similar configuration as the mask circuit 401.

Specifically, the first mask circuit 403*a* includes a NOT circuit 411*a* and a NOR circuit 412*a*. The NOT circuit 411*a* has its input terminal connected to the node of the first level shift circuit 203*a* (from which the level-shifted ON control signal S200*a* is outputted) while the output terminal of the NOT circuit 411*a* and the node of the dummy circuit 303 are connected to the input terminal of the NOR circuit 412*a*. Accordingly, the first mask circuit 403*a* masks a signal outputted from the node of the first level shift circuit 203*a* using a signal outputted from the dummy circuit 303 to generate a first masked signal S400*a*. The output terminal of the NOR circuit 412*a* is that of the first mask circuit 403*a* outputting the first masked signal S400*a*.

Similarly, the second mask circuit 403*b* includes a NOT circuit 411*b* and a NOR circuit 412*b*. The NOT circuit 411*b* has its input terminal connected to the node of the second level shift circuit 203*b* (from which the level-shifted OFF control signal S200*b* is outputted) while the output terminal of the NOT circuit 411*b* and the node of the dummy circuit 303 are connected to the input terminal of the NOR circuit 412*b*. Accordingly, the second mask circuit 403*b* masks a signal outputted from the node of the second level shift circuit 203*b* using a signal outputted from the node of the dummy circuit 303 to generate a second masked signal S400*b*. The output terminal of the NOR circuit 412*b* is that of the second mask circuit 403*b* from which the second masked signal S400*b* is outputted.

The masked signals S400*a* and S400*b* generically correspond to the masked signal S400.

The discriminator 502, including the RS flip-flop, is also referred to as "RS flip-flop 502". The RS flip-flop 502 has its set input (S input) connected to the output terminal of the NOR circuit 412*a* of the mask circuit 403 and its reset input (R input) connected to the output terminal of the NOR circuit 412*b* of the mask circuit 403.

Thus, the RS flip-flop 502 outputs a signal of high level as the discrimination result signal S500 from its Q output in response to pulses of high level in the first masked signal S400*a* outputted from the first mask circuit 400*a*, while outputting a signal of low level as the discrimination result signal S500 from its Q output in response to pulses of high level in the second masked signal S400*b* outputted from the second mask circuit 400*b*. In other words, a period during which the discrimination result signal S500 is on a high level and that during which the signal S500 is on a low level correspond to the ON command period T1on and the OFF command period T1off on the switching device 1, respectively.

As described, the discrimination result signal S500 is also inputted to the PMOS 215 of the first level shift circuit 203*a* and the NOT circuit 251 of the second level shift circuit 203*b*.

Referring now to the low-potential side driving device 12L, it includes a delay circuit 902 and the aforementioned driving circuit 900. The delay circuit 902, connected between the potentials GND and VCC to be supplied with power, is configured to obtain the ON/OFF command signal S2 on the low-potential side switching device 2 and delay the signal S2 to output the same as a signal S902 to the driving circuit 900. The delay circuit 902 is provided such that a delay time from the receipt of the ON/OFF command signal S1 at the high-potential side driving device 13H to the actual switching operation performed by the high-potential side switching device 1 is corrected at the driving device 12L, for example.

The driving device 13 of such configuration can achieve the same effects as the above-described driving devices 10 to 12 even when the conducting command and non-conducting command on the switching device 1 are given by separate signals, i.e., the ON control signal (conduction control signal) S100*a* and OFF control signal (non-conduction control signal) S100*b*. Setting a threshold value of the NOT circuit 313 of the dummy circuit 303 higher than that of the NOT circuit 213 of the level shift circuit 203*a* and that of the NOT circuit 223 of the level shift circuit 203*b* allows a masking process at the mask circuit 403 to be performed with more reliability.

Specifically, one of the ON control signal S100*a* and OFF control signal S100*b* includes iterative pulses, and the RS flip-flop 502 performs discrimination using pulses included in the masked signals S400*a* and S400*b*. Thus, even when a noise pulse included in the masked signals S400*a* and S400*b* causes a malfunction, a normal pulse (forming iterative pulses transmitted to the ON control signal S100*a* or OFF control signal S100*b*) next to the noise pulse allows return to a normal operation. At this time, the period of the malfunction is limited to a period that corresponds to the period T of the iterative pulses at most.

Since the ON/OFF command signal S1 and iterative pulse signal S112 are out of synchronization with each other in the driving devices 11 and 12, a delay time td may occur between the conducting/non-conducting command and the control signal S100 (FIG. 4). This delay time td is also reflected (transmitted) in a period from the issuance of the conducting command and non-conducting command to the actual switching operation of the high-potential side switching device 1. On the other hand, with the driving device 13, the ON control signal S100*a* and OFF control signal S100*b* include the conducting transition pulses and non-conducting transition pulses, respectively, and the RS flip-flop 502 performs discrimination using pulses, included in the masked signals S400*a* and S400*b*, that correspond to the conducting transition pulses and non-conducting transition pulses, respectively, which allows a reduction in the delay time td.

When the delay time td depends upon rising/falling of the ON/OFF command signal S1 and rising of the iterative pulse signal S112 (or the clock signal S111) as in the driving devices 11 and 12, the ON/OFF command signal S2 on the low-potential side switching device 2 and the clock signal S111 are brought into synchronization with each other in order to ensure a period (dead time) during which the switching devices 1 and 2 are inactive. However, the driving device 13 eliminates the need to synchronize the ON/OFF command signal S2 and the clock signal S111 since the delay time td does not depend upon the timing of the ON/OFF command signal S1 and iterative pulse signal S112. Thus, the driving device 13 does not require the synchronizing circuit 901 or interconnection, provided for the driving device 11L shown in FIG. 2, connecting the synchronizing circuit 901 and original clock signal generator 111 (such interconnection is prolonged in the case where the driving devices 11H and 11L are separate integrated circuits).

Further, the level shift circuits 203*a* and 203*b* include the PMOSs 215 and 225, respectively, allowing a reduction in power consumption of the driving device 13. The reason is as follows: upon detecting transition from the OFF command to ON command, for example, the RS flip-flop 502 maintains the Q output until transition is thereafter made from the ON command to OFF command. Thus, in the driving device 13, the switching device 1 can be switched upon detecting transition between the ON command and OFF command from the control signals S100*a* and S100*b*. Therefore, during a continuation of the ON command, the level shift circuit 203*b* transmitting the OFF command for detecting next transition (from the ON command to OFF command) may only be operated while the level shift circuit 203*a* transmitting the ON command may be suspended. Specifically, the level shift circuit 203*a* may be controlled such that a current does not flow over the current path 210.

Such suspension can be achieved since the driving device 13 is configured such that the PMOS 215 controls the conducting state/non-conducting state of the current path 210 in response to the discrimination result signal S500. Such suspension of the level shift circuit 203a allows a reduction in power consumption. Needless to say, the same applies to a period during which the OFF command continues.

Considering the case where the potential VS varies when the Q output of the RS flip-flop 502 is on a high level, a current for charging parasitic electrostatic capacitance of the HVNMOS 211 flows over the current path 210 through the diode 214 and noise resulting from the current does not appear in the signal S200a since the PMOS 215 of the level shift circuit 203a is in a non-conducting state at this time. However, currents flow over the current paths 220 and 310 through the resistors 222 and 312, respectively, with the PMOSs 225 and 315 being in a conducting state, so that noise resulting from the currents appears in the signals S200b and S300, which can be suppressed/removed by the mask circuit 403 and RS flip-flop 502. Similarly, in the case where the potential VS varies when the Q output of the RS flip-flop 502 is on a low level, noise can be suppressed/removed using the signals S200a and S300 outputted from the level shift circuit 203a and dummy circuit 303, respectively. In short, the effect of suppressing/removing noise can be obtained even if one of the level shift circuits 203a and 203b is suspended.

Further, the PMOSs 215 and 225 are each provided between the clamping diode (clamping device) and the potential VB (fourth potential), so that currents flowing through the PMOSs 215 and 225 are defined by the difference between the potentials VB and VS. This potential difference is smaller than that between the potentials VB and GND, eliminating the need to use a high voltage device (power device) for the PMOSs 215 and 225, which allows a cost reduction in this regard.

Figure 11:
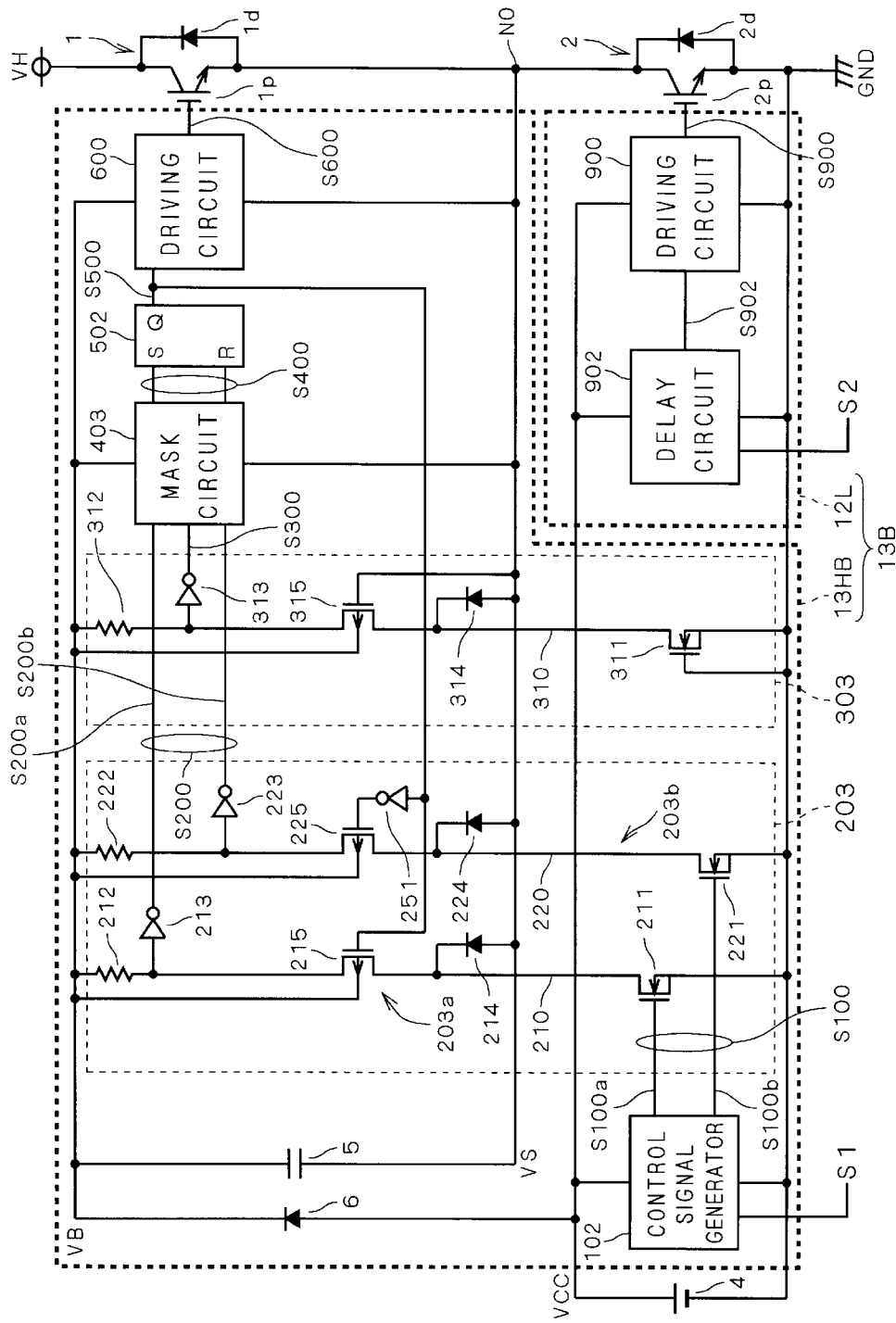
FIG. 11 is an explanatory circuit diagram showing a variant of the driving device according to the third preferred embodiment.

With the cost reduction described above, the driving device 13 may be modified into a driving device 13B as shown in FIG. 11. The driving device 13B will be described as a fourth specific structural example of the driving device 10. The driving device 13B shown in FIG. 11 includes a high-potential side driving device 13HB in place of the driving device 13H in the driving device 13 shown in FIG. 7. The driving device 13HB is configured to have a power supply circuit including a capacitor 5 and a bootstrap diode 6 added to the driving device 13H shown in FIG. 7. Specifically, the capacitor 5 is connected between the potentials VB and VS, and the diode 6 has its cathode and anode connected to the potentials VB and VCC, respectively. Such configuration allows the driving device 13B to operate with the single power supply 4.

<Fourth Preferred Embodiment>

Figure 12:
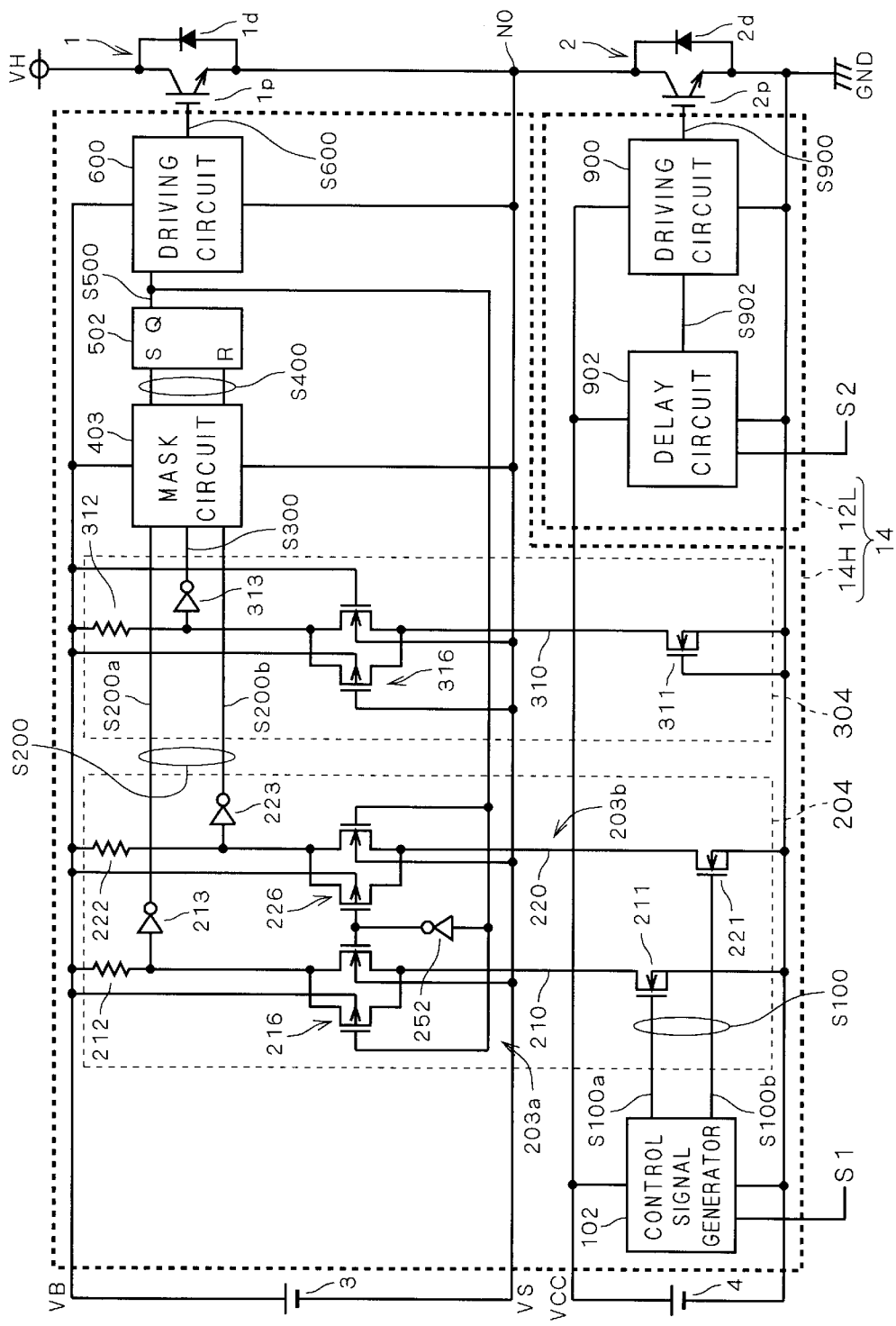
FIG. 12 is an explanatory circuit diagram showing a driving device according to a fourth preferred embodiment of the present invention.

A fifth specific structural example of the driving device 10 will be described using a driving device 14 according to a fourth preferred embodiment shown in FIG. 12. The driving device 14 has basically the same structure as the driving device 13 shown in FIG. 7 except that the driving device 13H is replaced by a high-potential side driving device 14H. The driving device 14H has basically the same structure as the driving device 13H except that the level shifter 203 and dummy circuit 303 are replaced by a level shifter 204 and a dummy circuit 304, respectively.

Figure 7:
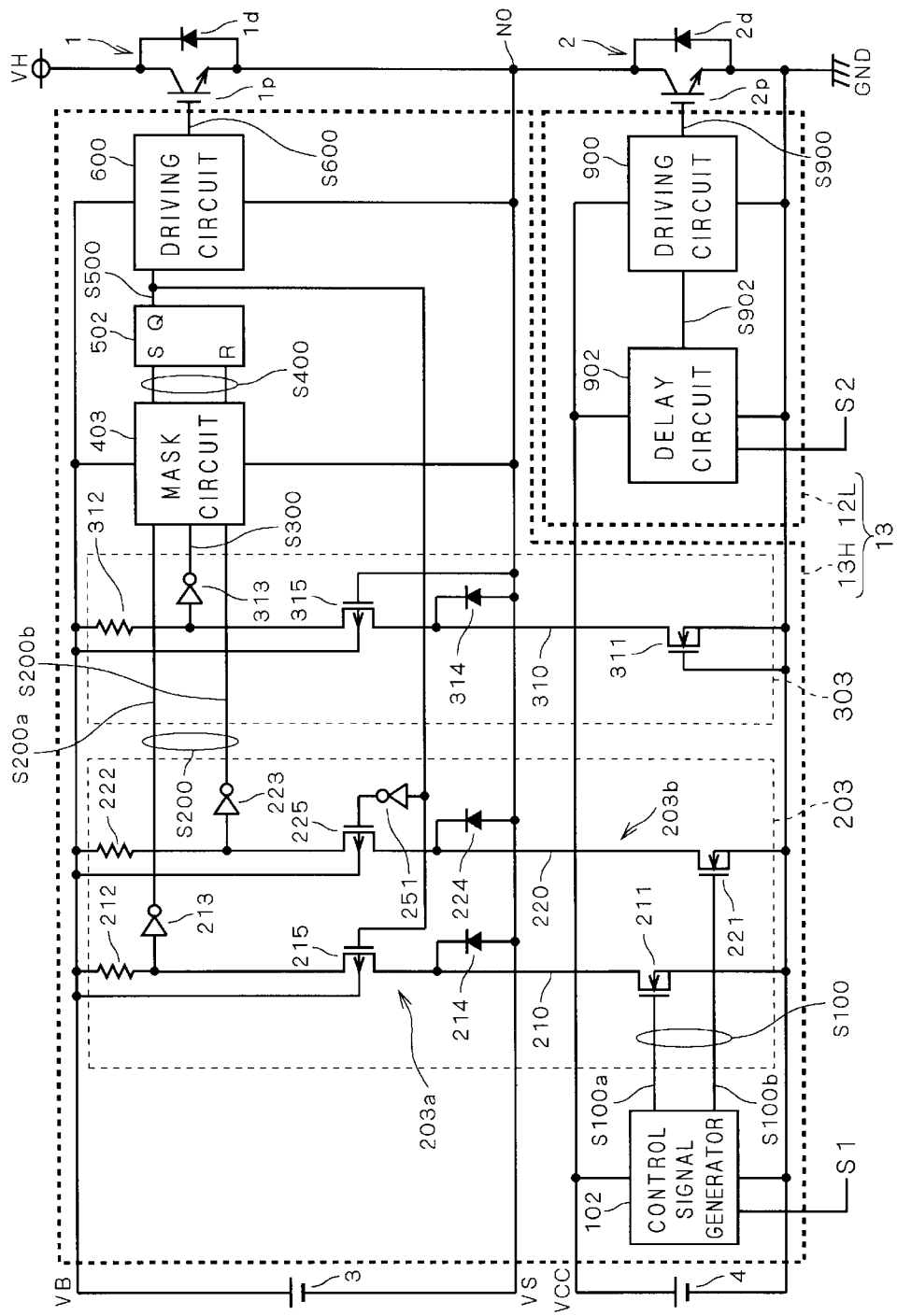
FIG. 7 is an explanatory circuit diagram showing a driving device according to a third preferred embodiment of the present invention.

The level shifter 204 is broadly divided into first and second level shift circuits 204a and 204b similarly to the first and second level shift circuits 203a and 203b shown in FIG. 7.

The first and second level shift circuits 204a and 204b are configured by replacing the PMOSs 215 and 225 in the level shift circuits 203a and 203b shown in FIG. 7 with analog switches (or second switching devices) 216 and 226, respectively, and removing the diodes 214 and 224. The level shifter 204 includes a NOT circuit 252 in place of the NOT circuit 251 of the level shifter 203.

The analog switches 216 and 226 each have P- and N-channel field-effect transistors connected in parallel to each other with the source and drain connected to the drain and source, respectively, between the P- and N-channel transistors. In this case, MOSFETs are used for the P- and N-channel field-effect transistors, and the analog switches 216 and 226 are so-called C-MOS analog switches having characteristics (values) substantially equal to each other.

The analog switches 216 and 226 have their main paths provided on the current paths 210 and 220, respectively, in the same position as the PMOSs 215 and 225 shown in FIG. 7. The P-channel MOSFET of the analog switch 216 and the N-channel MOSFET of the analog switch 226 have their gates connected to the Q output of the RS flip-flop 502, while the N-channel MOSFET of the analog switch 216 and the P-channel MOSFET of the analog switch 226 have their gates connected to the output terminal of the NOT circuit 252. The NOT circuit 252 has its input terminal connected to the Q output of the RS flip-flop 502. The substrate potentials of the respective N-channel MOSFETs of the analog switches 216 and 226 are both connected to the potential (or third potential) VS, while those of the respective P-channel MOSFETs of the analog switches 216 and 226 are both connected to the potential VB.

The dummy circuit 304 is configured by replacing the PMOS 315 with an analog switch 316 and removing the diode 314 from the dummy circuit 303 shown in FIG. 7. The analog switch 316 is configured in the same manner as the analog switches 216 and 226 having characteristics (values) substantially equal to those of the analog switches 216 and 226. The analog switch 316 has its main path provided on the current path 310 in the same position as the PMOS 315 shown in FIG. 7. As described, the dummy circuit 304 in the driving device 14H is basically configured in the same manner as the level shift circuits 204a and 204b except that, in the analog switch 316, the P-channel MOSFET has its gate connected to the potential VS and the N-channel MOSFET has its gate connected to the potential VB. The substrate potentials of the N- and P-channel MOSFETs of the analog switch 316 are connected to the potentials VS and VB, respectively.

The driving device 14 can achieve the same effects as the driving device 13. Specifically, the driving device 14 eliminates the need to provide another clamping diode (clamping device) since the diodes provided between the substrate and the source of the N-channel MOSFETs of the analog switches 216, 226 and 316, respectively, function as clamping diodes. This allows the number of components to be reduced, which can improve integration properties as compared to the driving device 13.

<Variant>

The driving devices 10 to 14 may be configured to process signals obtained by inverting the waveforms of the signals described above and shown in the timing charts. Further, the diodes 214, 224 and 314 may be replaced with clamping diodes configured by transistors.

While the invention has been shown and described in detail, the foregoing description is in all aspects illustrative and not restrictive. It is therefore understood that numerous modifications and variations can be devised without departing from the scope of the invention.

What is claimed is:

1. A driving device performing drive and control of at least a high-potential side switching device of two switching devices connected in series between a first potential and a second potential higher than said first potential, said driving device comprising:

a control signal generator configured to generate a control signal for a conducting command to bring said high-potential side switching device into a conducting state and a non-conducting command to bring said high-potential side switching device into a non-conducting state, thereby outputting said control signal from an output terminal;

a level shifter connected to said output terminal of said control signal generator and configured to level-shift said control signal with at least one level shift circuit to generate a level-shifted control signal; and a dummy circuit, wherein
a node between said two switching devices has a third potential,
said at least one level shift circuit and said dummy circuit each include:
a current path provided between said first potential and a fourth potential set higher than said third potential; and
a first switching device having a main path provided on said current path and a control terminal controlling conducting/non-conducting state of said main path, said control terminal of said first switching device in said at least one level shift circuit is connected to said output terminal of said control signal generator while said first switching device in said dummy circuit is always set at said non-conducting state, said at least one level shift circuit includes a first node outputting said level-shifted control signal while said dummy circuit includes a second node corresponding to said first node, said driving device further comprising:
a mask circuit connected to said first node of said at least one level shift circuit and said second node of said dummy circuit and configured to mask a signal outputted from said first node using a signal outputted from said second node to generate a masked signal; and
a discriminator configured to discriminate between said conducting command and said non-conducting command on said high-potential side switching device using said masked signal.

2. The driving device according to claim 1, wherein
said control signal generator includes a selective iterative pulse signal generator configured to generate an iterative pulse signal including iterative pulses as said control signal selectively only in one of a conducting command period for said conducting command on said high-potential side switching device and a non-conducting command period for said non-conducting command on said high-potential side switching device, said iterative pulses having a period shorter than said conducting command period and said non-conducting command period, and
said discriminator includes a first discriminator configured to discriminate between said conducting command and said non-conducting command using iterativeness of a plurality of pulses included in said masked signal.

3. The driving device according to claim 2, wherein
said first discriminator includes a one-shot pulse generator configured to use each of said plurality of pulses included in said masked signal as trigger and generate a pulse, for each trigger, having a width not smaller than said period of said iterative pulses.

4. The driving device according to claim 1, wherein
said control signal includes a conduction control signal corresponding to said conducting command on said high-potential side switching device and a non-conduction signal corresponding to said non-conducting command on said high-potential side switching device while said level-shifted control signal includes a level-shifted conduction control signal corresponding to said conduction control signal and a level-shifted non-conduction control signal corresponding to said non-conduction control signal, said output terminal of said control signal generator includes a conduction control signal output terminal outputting said conduction control signal and a non-conduction control signal output terminal outputting said non-conduction control signal, said at least one level shift circuit includes:
a first level shift circuit, in which said control terminal of said first switching device is connected to said conduction control signal output terminal of said control signal generator, configured to output said level-shifted conduction control signal from said first node; and
a second level shift circuit, in which said control terminal of said first switching device is connected to said non-conduction control signal output terminal of said control signal generator, configured to output said level-shifted non-conduction control signal from said first node, said masked signal includes first and second masked signals, and said mask circuit includes:
a first mask circuit connected to said first node of said first level shift circuit and said second node of said dummy circuit and configured to mask a signal outputted from said first node using a signal outputted from said second node to generate said first masked signal; and
a second mask circuit connected to said first node of said second level shift circuit and said second node of said dummy circuit and configured to mask a signal outputted from said first node using a signal outputted from said second node to generate said second masked signal.

5. The driving device according to claim 4, wherein
said control signal generator includes:
an iterative pulse signal generator configured to generate an iterative pulse signal including iterative pulses having a period shorter than a conducting command period for said conducting command on said high-potential side switching device and a non-conducting command period for said non-conducting command on said high-potential side switching device;
a first selector configured to selectively output said iterative pulse signal only in said conducting command period; and
a second selector configured to selectively output said iterative pulse signal only in said non-conducting command period, wherein said conduction control signal and said non-conduction control signal include said iterative pulses outputted from said first and second selectors, respectively, and said discriminator includes a second discriminator configured to discriminate between said conducting command and said non-conducting command using pulses included in said first and second masked signals.

6. The driving device according to claim 4, wherein said control signal generator includes:

a conducting transition pulse generator configured to generate a conducting transition pulse in synchronization with transition from said non-conducting command to said conducting command; and a non-conducting transition pulse generator configured to generate a non-conducting transition pulse in synchronization with transition from said conducting command to said non-conducting command, said conduction control signal and said non-conduction control signal include said conducting transition pulse and said non-conducting transition pulse, respectively, and said discriminator includes a third discriminator configured to discriminate between said conducting command and said non-conducting command using pulses corresponding to said conducting transition pulse and said non-conducting transition pulse included in said masked signal.

7. The driving device according to claim 4, wherein said first and second level shift circuits each further include a second switching device configured to control conducting/non-conducting state of said current path in response to a discrimination result outputted from said discriminator.

8. The driving device according to claim 7, wherein said first and second level shift circuits each further include a clamping device provided between said current path and said third potential, and said second switching device is provided between said clamping device and said fourth potential in each of said first and second level shift circuits.

9. The driving device according to claim 7, wherein said second switching device includes an analog switch having P- and N-channel field-effect transistors connected in parallel to each other, said N-channel field-effect transistor having its substrate potential set at said third potential.

* * * * *